United States Patent [19]

Shimizu et al.

[11] 4,041,518
[45] Aug. 9, 1977

[54] MIS SEMICONDUCTOR DEVICE AND METHOD OF MANUFACTURING THE SAME

[75] Inventors: Shinji Shimizu, Choufu; Seiichi Iwamatsu; Makoto Homma, both of Tokyo, all of Japan

[73] Assignee: Hitachi, Ltd., Japan

[21] Appl. No.: 677,023

[22] Filed: Apr. 14, 1976

Related U.S. Application Data

[63] Continuation of Ser. No. 445,658, Feb. 25, 1974, abandoned.

[30] Foreign Application Priority Data

Feb. 24, 1973  Japan .............................. 48-22545

[51] Int. Cl.² .................. H01L 29/78; H01L 29/04; H01L 27/02
[52] U.S. Cl. ..................................... 357/23; 357/41; 357/42; 357/43; 357/59
[58] Field of Search .................... 357/23, 41, 42, 43, 357/59

[56] References Cited

U.S. PATENT DOCUMENTS

| 3,699,646 | 10/1972 | Vadasz | 357/59 |
|---|---|---|---|
| 3,749,610 | 7/1973 | Swann et al. | 357/59 |
| 3,750,268 | 8/1973 | Wang | 357/23 |
| 3,764,413 | 10/1973 | Kakizaki et al. | 357/23 |

*Primary Examiner*—Edward J. Wojciechowicz
*Attorney, Agent, or Firm*—Craig & Antonelli

[57] ABSTRACT

A metal-insulator semiconductor (MIS) device is manufactured by initially forming, on a semiconductor substrate, an insulating film having a hole therethrough and depositing silicon on the substrate to form a first monocrystalline silicon film in the hole and a polycrystalline silicon film on the insulating film. Then, a further insulating film is formed on the first silicon film, and a second silicon film is formed on the further insulating film. The second silicon film and the further insulating film are removed, so that the monocrystalline and polycrystalline parts of the first silicon film are exposed at both sides of the remaining part of the second silicon film and the further insulating film. Finally, an impurity is diffused to form a source and a drain region in the monocrystalline silicon film and conductive layers of polycrystalline silicon are disposed contiguous to the source and drain regions.

31 Claims, 32 Drawing Figures

MIS SEMICONDUCTOR DEVICE AND METHOD OF MANUFACTURING THE SAME

This is a continuation, of application Ser. No. 445,658 filed Feb. 25, 1974, now abandoned.

FIELD OF THE INVENTION:

This invention relates to improvements in MIS or MOS devices and, more particularly, to integrated circuits of the insulated silicon gate type.

In manufacturing semiconductor devices, photoengraving or photo etching techniques are indispensable for shaping or selectively removing materials such as insulating films, metal films and semiconductor layers.

The photo-engraving technique comprises steps of coating a photosensitive, etchant-resistive material (photoresist) on a layer to be etched, disposing a photostencil or photomask on the photoresist coating, exposing the photoresist to light rays through the photomask, developing the exposed photoresist to obtain an etchant resistive film of the developed photoresist, which partially covers the layer to be etched, in accordance with a pattern corresponding to the pattern on the photomask, and then dipping the combination thus obtained in an etchant to partially etch away the layer under the photoresist coat.

In the photo-etching process, at least the following allowances must be taken into consideration.

1. an allowance for errors in the mask pattern, which might occur during manufacturing of the photomask,
2. an allowance for an error due to the diffraction of light during exposure, and
3. an allowance for an error in the alignment or the registration of the photomask.

By way of example, as the allowance of the pattern of a photomask when forming a protuberance for an electrode, or forming a hole by the etching working, a width of at least 6–8 $\mu$ is required. Further, the allowance for aligning the photomask thus fabricated, on the semiconductor wafers, is at least $4\mu$.

What is worse is that the etching step with the photomask is not carried out only one time, but four or five or more treatments are usually necessary. These various errors, accordingly, must be considered during the respective etching steps. For this reason, the dimensions required for a semiconductor device, for example, a conventional MOSIC having an aluminum gate electrode (the length within which the source and drain regions of a MOSFET is contained) are approximately $70\mu$ or more.

When the area of a unit circuit element becomes large, there are the disadvantages that the area of a semiconductor chip is inevitably becomes large when forming the semiconductor devices as an integrated circuit (IC), a high degree of integration becomes impossible and an increase in parasitic capacitances cannot be avoided. As is well known, in order to increase the speed of operation of the semiconductor device, a reduction in the parasitic capacitance must be achieved and, ultimately, the semiconductor device must be of small size.

It is, therefore, an object of the present invention to provide a MIS- or MOS-type integrated circuit in which the area for a unit circuit element is remarkably small.

It is another object of the present invention to provide a semiconductor device in which electrode portions are remarkably small to thereby diminish parasitic capacitances.

It is a further object of the present invention to provide integrated circuits having a high degree of integration.

It is a still further object of the present invention to provide a method in which the number of steps which require the accurate alignment of photomasks is reduced.

BRIEF SUMMARY OF THE INVENTION:

In accordance with the present invention a metal-insulator-semiconductor device is formed of monocrystalline semiconductor regions of a conductivity type opposite to that of a semiconductor substrate on which the regions are formed. Typically these regions constitute the source and drain regions of a field effect transistor. To form these regions, a semiconductor layer is formed on selected surface portions of a substrate and on an insulating film overlying the substrate. The layer is of polycrystalline structure on the film, while it is of monocrystalline structure on the substrate. As a result, the polycrystalline portions of the film can be used for source and drain conductor leads, as well as gate electrode layers.

As will be explained in connection with the following embodiments, the present invention with the above construction has a very wide range of applications, and can provide various forms of semiconductor devices.

While the embodiments of the present invention will be explained hereunder with reference to the accompanying drawings, the present invention is not restricted to these aspects only.

BRIEF DESCRIPTION OF THE DRAWINGS:

FIG. 13b is a plan view of the MOSFET shown in FIG. 13a.

DETAILED DESCRIPTION OF THE INVENTION:

Embodiment 1

Figure 1:
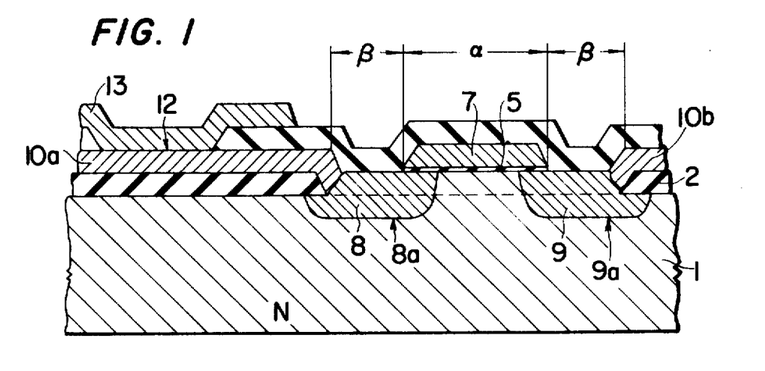
FIG. 1 is a sectional view showing the essential portions of an insulated silicon gate type IC according to the present invention.
Figure 2A:
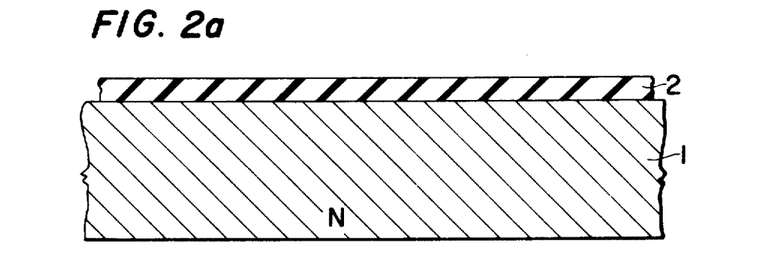
FIGS. 2a to 2i are sectional views of a semiconductor wafer in various steps for manufacturing the MOSIC of FIG. 1.

FIG. 1 is a sectional view for illustrating a MOS device according to the present invention. The MOS device is manufactured by the following steps:

As shown in FIG. 2a, an N-type silicon substrate 1 is heated to about 1200° C in an oxidizing atmosphere, to form an oxide film 2 (SiO$_2$) the thickness of which is approximately 1μ (micron meter).

Figure 2B:
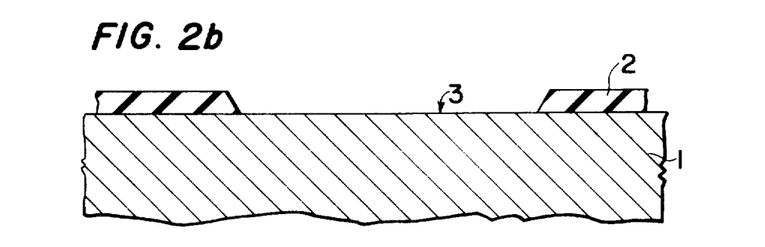

An opening 3 is formed in the oxide film 2 as shown in FIG. 2b, by a conventional photo-engraving technique, as follows. Photoresist is applied onto the oxide film 2, a photo-stencil is placed thereon, light rays impinge through the stencil onto the photoresist, and that part of the photo-resist film which corresponds to the opening 3 is thereafter removed. Using the photoresist film thus formed as an etchant resistive film, the part with no etchant resistive film is selectively etched to provide the opening 3.

Figure 2C:
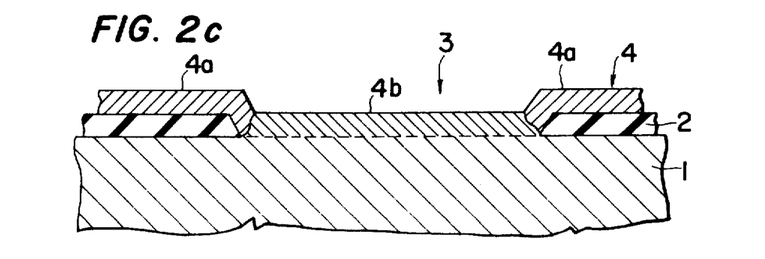

As is shown in FIG. 2c, a silicon film 4 of a predetermined conductivity type (N-type in this case) and a specific resistance of desirably 1-10 ohm is formed in the opening 3 and on the oxide film 2 by conventional chemical-vapor-deposition (CVD) process (e.g., thermal decomposition of monosilane SiH$_4$ at about 400° C). In the silicon film 4, part 4a formed on the oxide film 2 becomes polycrystalline while part 4b formed in the 3 becomes monocrystalline. The thickness of the silicon film 4 is about 1μ.

Figure 2D:
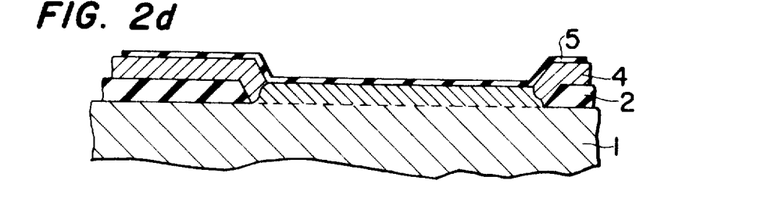

The substrate thus obtained is heated in an oxidizing atmosphere, to form an oxide film 5 (SiO$_2$) of 1000 ~ 1500 A thickness on the entire area of the silicon film 4, as shown in FIG. 2d. The oxide film 5 is to become an insulating film for a gate electrode.

Figure 2E:
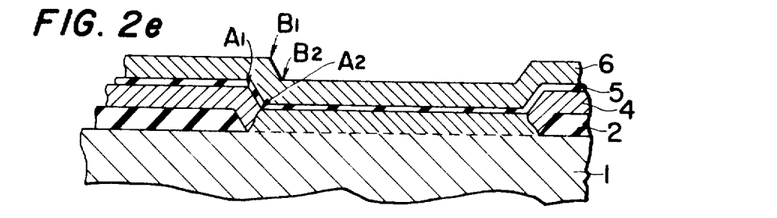

On the oxide film 5, as shown in FIG. 2e, a silicon film 6 for the gate electrode is formed to a thickness of 0.5μ by the CVD process. This silicon film 6 is polycrystalline, and the gate electrode subsequently if formed of a portion of this film.

Figure 2F:
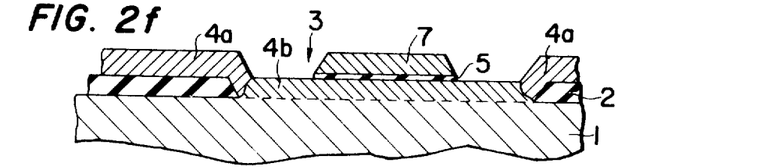

The gate electrode 7 is formed, as shown in FIG. 2f, in such a way that the silicon film 6 is selectively etched by a conventional photo-engraving technique. In this case, alignment of the photomask is necessary. The alignment is conducted by making use of a shoulder portion A$_1$ or a corner portion A$_2$ of the silicon film 4 or a shoulder portion B$_1$ or a corner portion B$_2$ of the silicon film 6. Since the contour of the oxide film 2 are accurately transferred to the polycrystalline silicon film 6, the locations of the shoulder or corner portions of the silicon film 4 or 6 are comparatively precise with respect to the location of the original opening 3. The gate electrode 7 is formed as described above. Thereafter, the oxide film 5 is etched away except for the portion underlying the gate electrode 7.

Figure 2G:
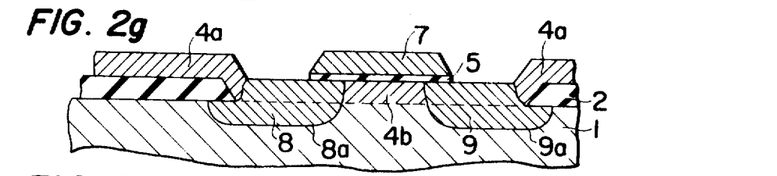

Next, an impurity is diffused, as shown in FIG. 2g, into the exposed silicon film 4, i.e., the exposed portions of the monocrystalline layer 4b and the exposed polycrystalline layers 4a, as well as the gate electrode 7. Since, in this embodiment, the silicon substrate 1 is of the N-type, the impurity to be used in the diffusion is of P-type, for example, boron. During this step, selective diffusion is carried out using, as a mask, the gate electrode 7 and the oxide film 5 formed thereunder. A source region 8 and a drain region 9 are formed, and P-N junctions 8a and 9a are formed at the interfaces between the respective regions and the silicon substrate 1.

Figure 2H:
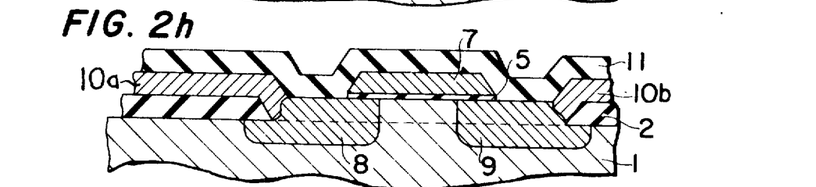

The polycrystalline silicon films 4a and joining to the source region 8 and the drain region 9 are selectively etched by a conventional photoengraving technique, to thereby remove the unnecessary silicon film and to form electrodes 10a and 10b as shown in FIG. 2h. A protective film 11 is subsequently formed for the purpose of protecting the surfaces of the electrodes 10a and 10b thus obtained as well as the gate electrode 7. The protective film 11 is formed of an oxide film (SiO$_2$) to a thickness of 1μ by a CVD process.

Figure 2I:
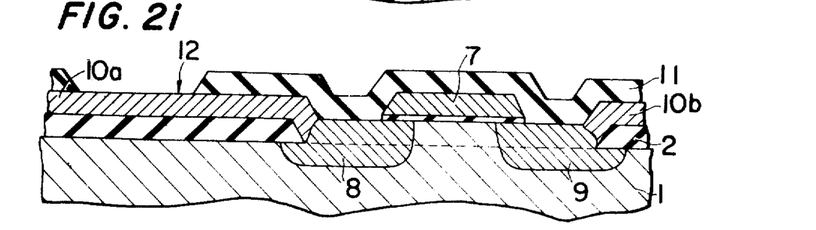

In predetermined portions of the protective film 11 formed by the preceding step, as shown in FIG. 2i, contact holes 12 are formed by conventional photo engraving techniques. The contact holes 12 may be provided so as to face the electrodes 10a and 10b below the protective film 11. During this etching step, high precision of the dimensions is not required.

Subsequently, an aluminum film is evaporated over the entire area of the contact holes 12 and on the protective film 11. The aluminum film is connected to the electrodes 10a, 10b and the gate electrode 7. The aluminum film is etched by a conventional photo-etching working utilizing a photoresist, to form terminal portions 13, contacting the respective electrodes to obtain the MIS device shown in FIG. 1. (Wirings by the evaporated aluminum film for leading out the gate electrode 7 and the electrode 10b joined to the drain region 9 are effected in the same manner as in the prior-art manufacturing process of MIS devices. They are omitted in FIG. 1 in order to avoid a complication of the drawing.)

As will be understood from this embodiment, according to the present invention, the step at which strict precision of the dimensions is required for the photomask or photo-stencil alignment is only the step of forming the gate electrode. Considerably high precision is not needed for the other steps, even when the etching is performed with photomask alignment.

More concretely, the width α of the gate electrode 7 may be approximately 8μ considering the precision of the dimensions of the photomask itself and the alignment precision thereof. The width β of each of the portions formed over the source and drain regions on both sides of the gate electrode 7 may be approximately 4μ. Thus, the source and drain regions 8 and 9 may be formed approximately within a range of 16μ. It is thus understood that the size of the device is extremely reduced as compared with the prior-art MIS device.

Another important fact is that the electrodes 10a and 10b respectively adjoining the source region 8 and the drain region 9 are formed of the polycrystalline silicon film. Since the respective portions are formed in a continuous manner, they are remarkably small in size. It is apparent that, in the end, parasitic capacitance hardly exists between the source region or drain region and the electrode coupling thereto.

In this embodiment, for the material for the gate electrode 7, metallic materials such as molybdenum may be used. Further, the impurity may be introduced by ion-implantation techniques in the step of FIG. 2g.

EMBODIMENT 2

Figure 3:
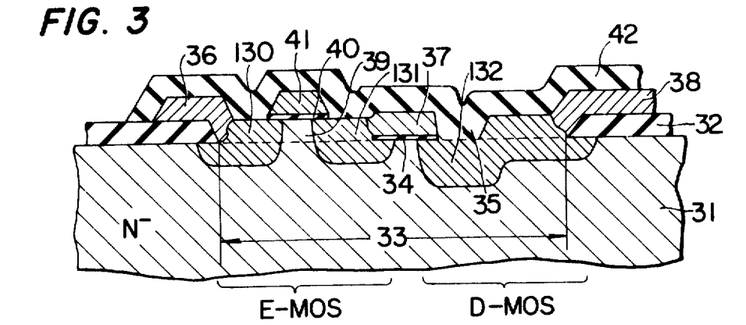
FIG. 3 is a sectional view showing the essential portions of an E/D MOSIC according to the present invention.

FIG. 3 is a sectional view for explaining a so-called (enhancement/depletion) E/D MOS device in which an enhancement type drive MOS device and depletion type load MOS device are juxtaposed.

While the manufacturing steps of this MOS device are not illustrated individually, they are in brief as follows:

An N⁻ -type silicon substrate 31 is heated to about 1200° C in an oxidizing atmosphere, to form an oxide film 32 (SiO₂) whose thickness is approximately 1μ.

An opening portion 33 is formed in such way that the oxide film 32 is subjected to the selective etching process making use of a photoresist film. The opening portion becomes a part at which electrodes of the enhancement type drive MOS device and the depletion type load MOS device are formed by steps to be described later.

The silicon substrate 31 thus treated is heated in an oxidizing atmosphere, to form an oxide film 34 approximately 1000 A thick. Only on that part of the oxide film 34 on which the gate electrode is to be formed, a photoresist film is provided. Using it as a mask, the oxide film is selectively etched, and the part underlying the mask remains.

Subsequently, a silicon film is formed on the oxide films 32 and 34 and in the opening 33 by the CVD process. As the silicon film, a single crystal silicon layer is formed by epitaxial growth at the part held in contact with the silicon substrate 31 and polycrystalline silicon films are formed at the parts in contact with the oxide films.

An opening portion 35 is formed in the silicon film. Therewith, the polycrystalline silicon film, which forms an electrode 36, the gate electrode 37 and an electrode 38 remains after etching and removing the other unnecessary parts.

Subsequently, an oxide film 40 of about 1000 A thickness is formed on the single crystal silicon layer 39 by oxidizing the silicon film 39 and etching the unnecessary portions of the oxide film 40. A gate electrode 41 of polycrystalline silicon is formed thereon by the chemical vapor deposition of silicon and the etching of the unnecessary portions thereof.

Then, a P type impurity is diffused into the silicon films and the substrate in the same manner as in Embodiment 1, to form regions 130, 131 and 132.

A protective film 42 (SiO₂) is formed by the CVD process, so that the conductive portions of the gate electrodes 37, 41, the electrodes 36, 38, etc. formed by the above steps may be completely covered.

Thereafter, the protective film 42 is provided with contact holes communicating with the electrodes which underlie it. Aluminum wiring for leading out the electrodes to the outside is formed through the contact holes. The aluminum wiring is effectively formed by aluminum evaporation and selective photo-etching.

In the above embodiment, where the impurity concentration of the silicon substrate 31 is, for example 1 × 10¹⁴ atoms/cc, the impurity concentration of the single crystal silicon layer 39 can be 1 × 10¹⁵ atoms/cc. Thus, in accordance with the present invention, the MIS device can be produced through simple steps by utilizing the substrate itself and the portion of the single crystal silicon layer formed by epitaxial growth.

The regions 130 and 131 and the gate 41 constitute and enhancement type MOSFET and the regions 131 and 132 and the gate 37 constitute a depletion type MOSFET.

According to the preceding embodiment, a plurality of portions of differing impurity concentration can be formed on the same substrate. There will be subsequently described a case where, on the basis of a similar concept, two or more regions of different conductivity types are formed, and a complementary MOS device (C-MOS) including MOSFETs of different types is made by utilizing the regions.

EMBODIMENT 3

Figure 4:
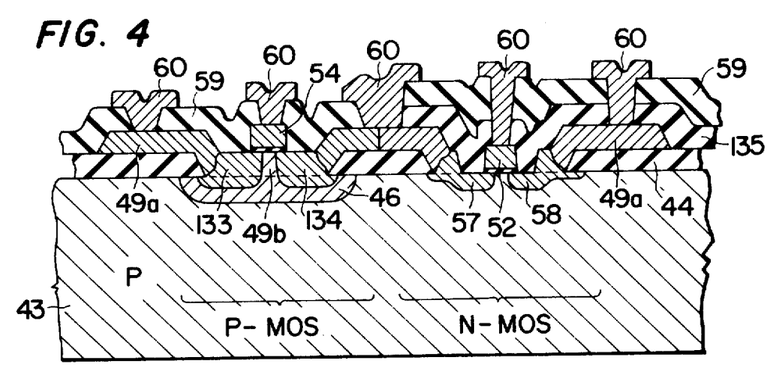
FIG. 4 illustrate a sectional view showing the essential portions of a complementary MOSIC according to this invention.

FIG. 4 is a sectional view showing the principal parts of a C-MOS device which has an N-channel MOSFET on the right side and a P-channel MOS device on the left side. This device is manufactured by the following steps.

Figure 5A:
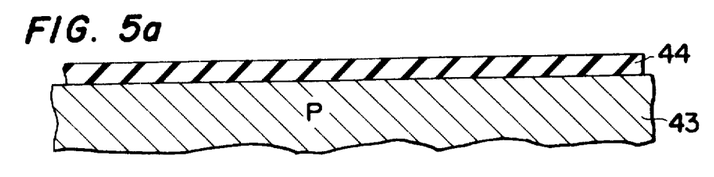
FIGS. 5a to 5h are sectional views of a semiconductor wafer in various steps for manufacturing the MOSIC of FIG. 4.

As shown in FIG. 5a, a P-type silicon substrate 43 is heated to bout 1200° C in an oxidizing atmosphere, to form an oxide film 44 (SiO₂) which is approximately 1μ thick.

A photoresist film is provided on the oxide film 44 except for part at which an opening is to be formed. The part of the oxide film which is not covered with the photoresist film is selectively etched to form an opening 45 as shown in FIG. 5b; the photoresist film is thereafter removed.

Figure 5B:
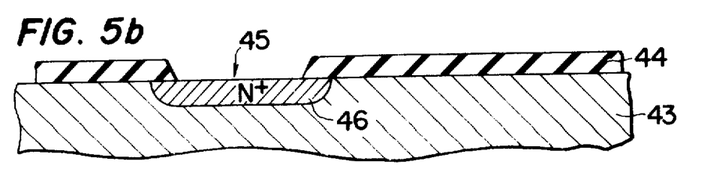

Subsequently, also as shown in FIG. 5b, phosphorus is diffused as an impurity into the silicon substrate 43 through the opening 45, to form a N⁺ diffused region 46. The region 46 is used as an isolation region. The depth of the isolation region 46 is, for example, approximately 1μ as measured from the surface of the silicon substrate 43.

Figure 5C:
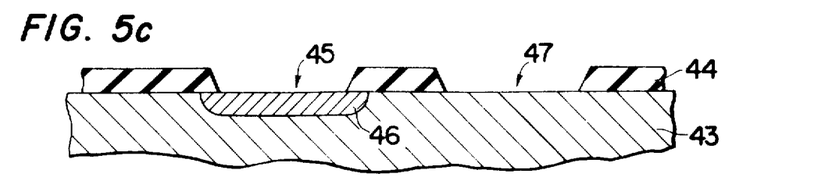

On the oxide film 44 thus treated, a photoresist film is again provided. The photoresist film does not cover a part at which an N-channel MOSFET is to be formed. Then, as shown in FIG. 5c, the part of the oxide film 44 which is not covered with the photoresist film is etched away, to form another opening 47, whereupon the photoresist film is removed. The oxide film 44 thus obtained has the openings 45 and 47.

Figure 5D:
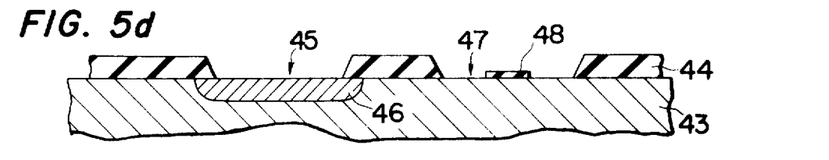
Figure 5E:
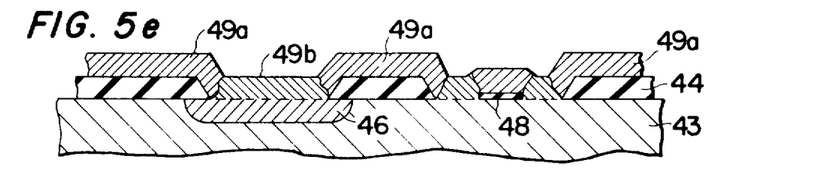

Thereafter, an oxide film (SiO₂) approximately 1000 A thick is formed in the openings 45 and 47 by the thermal oxidation of the silicon substrate 43. And, as shown in FIG. 5d, the thin oxide film is subjected to the etching utilizing a photoresist film as an etchant resistant mask, to form an oxide film 48. A silicon film 49 is subsequently formed, as shown in FIG. 5e, on the surfaces of the oxide films 44 and 48 and in the openings 45 and 47 by the conventional CVD process. As explained previously, the parts of the silicon film 49 directly in contact with the silicon substrate 43 and the diffused region 46 become monocrystalline while the other parts in contact with the oxide films 44 and 48 become polycrystalline.

Figure 5F:
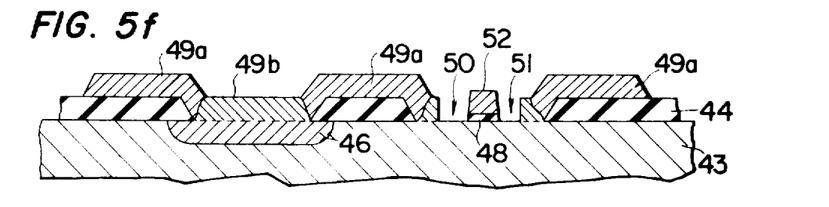

As shown in FIG. 5f, the silicon film 49 thus obtained is selectively etched utilizing a photoresist, to form groove portions 50 and 51 on both sides of the oxide film 48 and to form the gate electrode 52. Subsequently, the surface of the silicon film 49 is thermally oxidized to form an oxide film having a thickness of approximately 1000 A, and a polycrystalline silicon film is deposited on this oxide film by the CVD process.

Figure 5G:
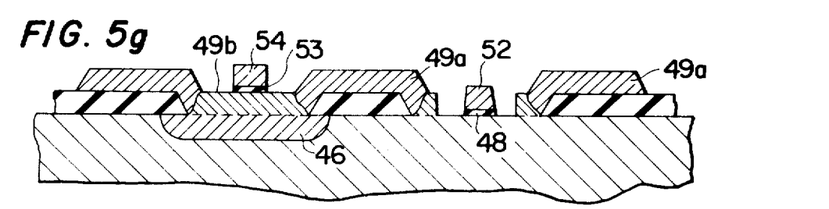
Figure 5H:
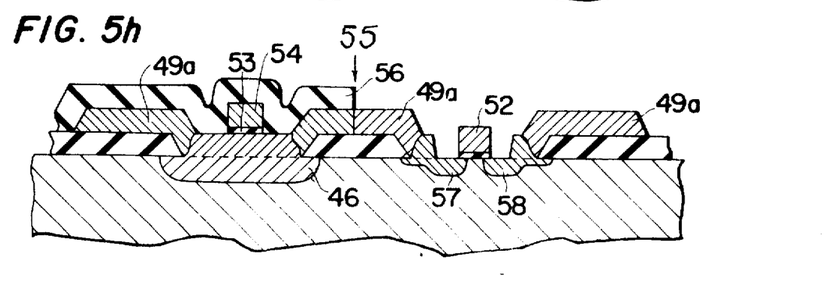

As shown in FIG. 5g, the latter-mentioned silicon film is selectively etched away to form the gate electrode 54 making use of photoresist. The latter mentioned oxide film is selectively removed to leave the oxide film 53 under the gate electrode 54. In the etching process, so-called self-alignment etching is effected in which the gate electrode 54 itself is used as an etchant resistive film. In the left half with respect to a line 55, as shown in FIG. 5h, a silicon oxide film 56 is deposited by the conventional CVD process (for example, oxidation of thermally decomposed SiH₄). In the right half with respect to the line 55, an N-impurity for example, phosphorus, is diffused to form a drain region 57 and a source 58, to make the electrode portions 49a joining these regions 57 and 58 conductive and to make the gate electrode 52 conductive (those parts with fine oblique lines illustrate the silicon layers made conductive).

Next, the right half with respect to the line 55 is covered with another oxide film (SiO₂)135 (shown in FIG. 4) deposited by the CVD process, while the oxide film 56 covering the part at which the P-channel MISFET is to be formed is removed. Then a p-type impurity, for example, boron is diffused into this part. By this diffusion, as shown in FIG. 4, the p-type regions 133 and 134 are formed in the N type region and the N type epitaxial layer. Further, the gate electrode 54 and the polycrystalline silicon layers 49a connected to the regions 133 and 134 are made conductive.

Upon completion of the preceding step, an oxide film 59 ($SiO_2$) is further formed over the entire area by the CVD process as shown in FIG. 4. After providing holes communicating with the respective electrodes, wirings of aluminum 60 are formed by the use of the same means as in Embodiment 1.

According to the present invention, two different types of regions are formed on a single semiconductor substrate, and a MOSFET of the p-channel type which is constituted by the regions 133 and 134 and the silicon layer 54 and a MOSFET of the N-channel type, which is constituted by the regions 57 and 58 and the silicon layer 52, are obtained thereon. In particular, since the deposited polycrystalline silicon film is used for the wirings as it is, the area of the wiring portions is remarkably small, with the result that the parasitic capacitances of the electrode portions are remarkably small. On the other hand, the generation of a parasitic MOSFET can be prevented by making the impurity concentration of the isolating region 46 (well region) high.

EMBODIMENT 4

Figure 6:
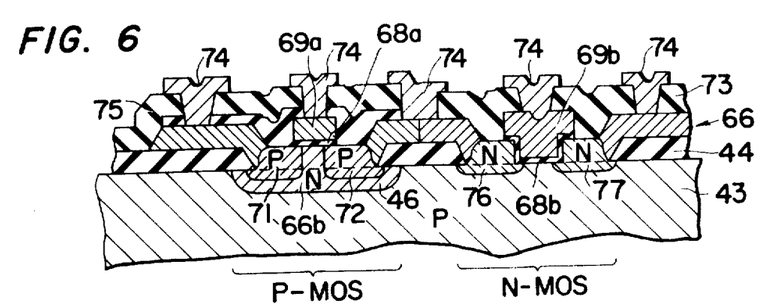
FIG. 6 is a sectional view of another complementary MOSIC according to this invention.

FIG. 6 illustrates another embodiment of a C-MOS device.

Similarly, to the foregoing steps shown in FIGS. 5a to 5c, a p-type silicon substrate 43 is heated in an oxidizing atmosphere to form an oxide film 44 on the silicon substrate 43, an opening 45 (shown in FIG. 5b) is formed in the oxide film 44, and an N-type impurity is diffused into the silicon substrate 43 through the opening 45 to form a N type isolating region 46. Thereafter, another opening 47 (shown in FIG. 5c) is formed in the oxide film 44.

Figure 7A:
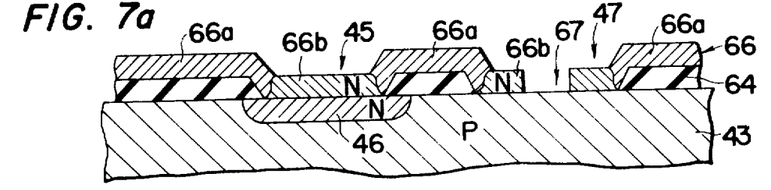
FIGS. 7a to 7d are sectional views of a semiconductor wafer in various steps for manufacturing the MOSIC of FIG. 6.

As shown in FIG. 7a, a silicon film 66 of a N type is deposited on the oxide film 44 and in the openings 45 and 47 by the CVD process. The silicon film 66a on the oxide film 44 is polycrystalline, while the silicon films 66b in the openings 45 and 47 are monocrystalline.

Figure 7B:
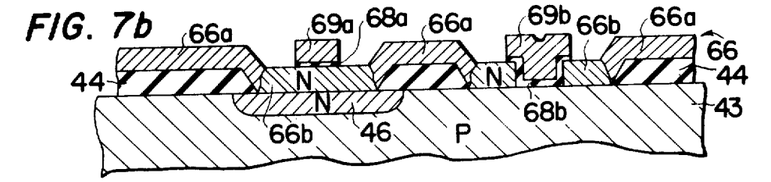

Subsequently, an opening 67 is formed in the single crystal silicon film 66b by the etching process utilizing a photoresist.

Next, a silicon oxide film is formed over the entire area of the silicon film 66 and in the opening 67 by the thermal oxidation. A p-type polycrystalline silicon film is deposited over the entire area of the oxide film. Then, the silicon film and the oxide film is subjected to selective etching employing photoresist, to form gate electrodes 69a and 69b. Under the gate electrodes 69a and 69b parts 68a and 68b of the oxide film are retained as gate insulators.

Figure 7C:
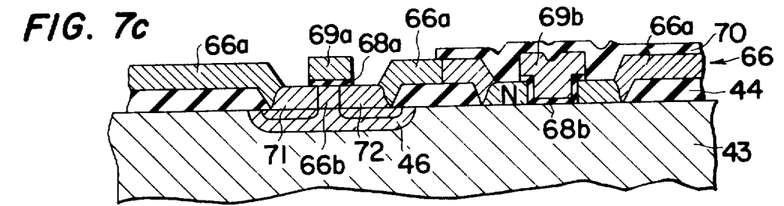

Subsequently, as shown in FIG. 7c, an oxide film 70 is formed on parts of the silicon films 66 and 69b by the CVD process, under which parts the N-MISFET is to be formed, and an impurity, for example, boron is diffused into the monocrystalline layer 66b, the N type region 46 and polycrystalline silicon layers 66a and 69a, to thereby form a source region 71 and a drain region 72 and to make the gate electrode 69a and the silicon layers 66a connected to the regions 71 and 72 conductive.

Figure 7D:
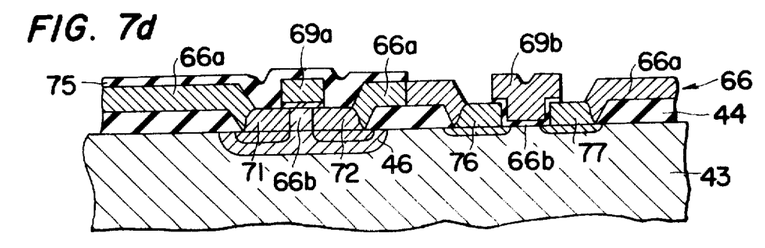

As shown in FIG. 7d, the portions which are not covered with the oxide film 70 are covered with another silicon oxide film 75 which is deposited by the conventional CVD technique, while the oxide film 70 is removed to expose the deposited silicon layers 69b, 66a and 66b. Then, an impurity, for example phosphorus is diffused into the silicon layers 69b, 66a and 66b and into the substrate 43 which are not covered with the oxide film 75, to form a drain region 76, a source region 77, and to make the polycrystalline silicon layers 66a and 69b conductive.

Thereafter, an oxide film 73 is deposited over the entire surface of the substrate 43 by the CVD process. After providing contact holes in the oxide film 73, electrodes 74 making contact with the respective electrodes are formed.

Figure 8:
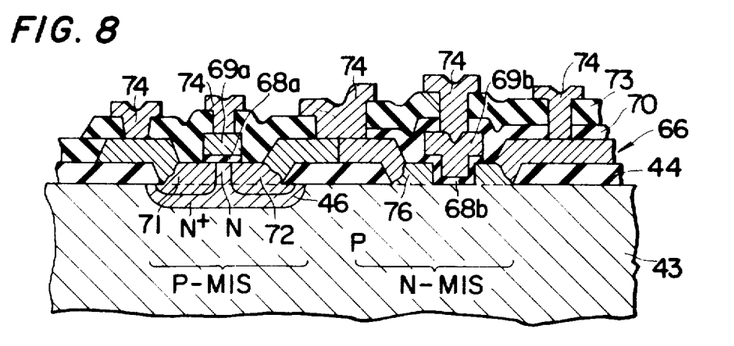
FIG. 8 shows a sectional view of a modification of the MOSIC of FIG. 6.

Suitably selecting the conductivities of the deposited N type silicon layer 66 and the deposited p type silicon layer 69, the last mentioned diffusion step is unnecessary, and in such case, the resulting structure is as shown in FIG. 8.

EMBODIMENT 5

Figure 9:
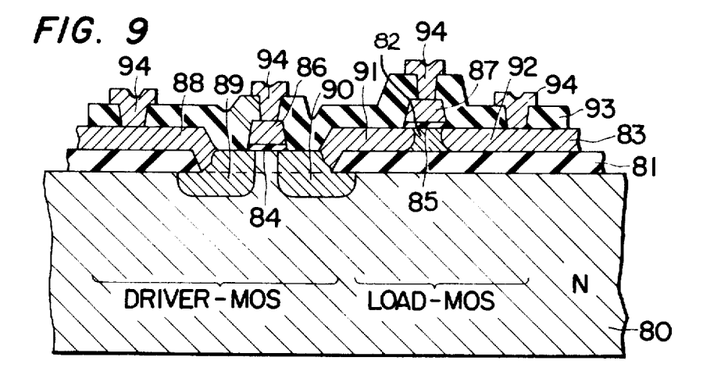
FIGS. 9 to 11 show sectional views of different types of silicon gate MOSICs according to this invention.

FIG. 9 is a sectional view of a further embodiment in which load MOSFET is produced in the polycrystalline silicon layer.

This MOS device is fabricated by the following method steps: First, the surface of a silicon substrate 80 of the N-type is thermally oxidized to form an oxide film 81. An opening is formed in the oxide film by a conventional photoengraving technique, and a silicon film 83 is deposited by the CVD process so as to entirely cover the opening and the oxide film 81. Single crystal silicon is epitaxially grown in the opening, while a polycrystalline silicon film is formed on the oxide film 81.

Subsequently, a silicon oxide film approximately 1000 A thick is formed on the upper surface of the silicon film 83 by thermal oxidation of the silicon film 83 and a silicon film is deposited on the oxide film. The silicon film is selectively removed by photo-engraving techniques, to leave the gate electrode-to-be portions 86 and 87. The oxide film is selectively etched using the remaining silicon portions 86 and 87 as an etching mask, to leave oxide films 84 and 85.

Next boron is diffused into the silicon layers and the substrate to form the P-type electrode 88, a P type source region 89, a P type gate electrode 86, a P type drain region 90, a P type source region 91, a P type gate electrode 87 and a P type drain region 92, except for the portion 82 of polycrystalline film 83 which remains N-type silicon beneath the gate electrode 87.

Subsequently, an oxide film 93 is formed over the entire area by the CVD process. It is formed with contact holes by the etching working utilizing photoresist. Further, aluminum is evaporated over the entire area, and shaped into electrodes 94 by the etching working utilizing photoresist.

The MOS device obtained by this embodiment has a feature in that the load MOS device is formed of the polycrystalline silicon.

More specifically, with the device of the present embodiment, the use of the polycrystalline silicon MOSFET for the load renders the mobility of electrons or holes small as compared with the use of the single crystal silicon MOSFET. For this reason, even when the area of the load MOSFET is small, the resistance can be made high. Thus, the size of the load MOSFET can be reduced to 1/5 or 1/10 in comparison with the case of using the single crystal silicon.

EMBODIMENT 6

Figure 10:
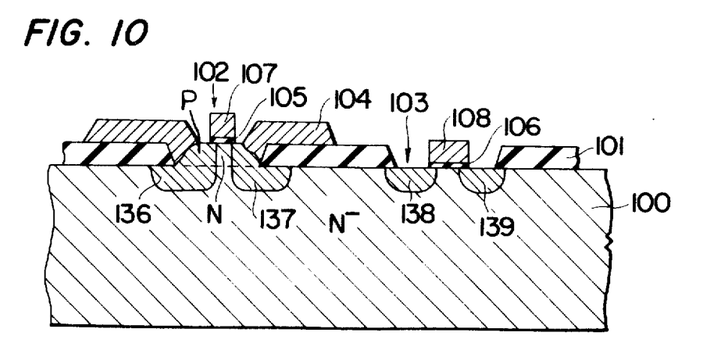

FIG. 10 shows a further embodiment in which two types of MOSFETs of differing threshold voltages are formed in the same silicon substrate.

In manufacturing this MOS device, an N⁻ silicon substrate 100 is prepared, an an oxide film 101 is formed on its surface by thermal oxidation. Openings 102 and 103 are formed in the oxide film 101 by an etching process utilizing photoresist, and an N type silicon layer 104 is formed only on the side of the opening portion 102 by the CVD process. Thereafter, an oxide film is formed and silicon is deposited on the oxide film over the entire area, and these layers are subjected to etching working with photoresist, to form the oxide films 105 and 106 and gate electrodes 107 and 108 laminated thereon. Boron is diffused into the substrate 100 and the deposited silicon layers, to form the O type regions 136 to 139 and to make the polycrystalline silicon conductive. Thereafter, the workings such as the formation of an oxide film for protection of the electrodes, the provision of contact holes and the wiring with aluminum are carried out by the same procedures as in the previous embodiments, to complete the device.

As in apparent from this embodiment, by using an N-type substrate for the silicon substrate 100 and an N-type material for the silicon layer 104, an MOS device, in which the MOSFET on the left side and the MOSFET on the right side have different threshold voltages $V_{th1}$ and $V_{th2}$, in spite of the employment of the same silicon substrate 100, can be simply produced.

EMBODIMENT 7

Beneath the gate electrode, an oxide film of approximately 1000 A in thickness is formed as an insulating layer, by which the gate electrode is electrically isolated from a source region and a drain region. As the width of the gate electrode is made smaller, the problem discussed below arises.

In the above embodiments, polycrystalline silicon develops along the edges of the opening (for example, the opening 3 in FIG. 2c) at the periphery of the epitaxially grown monocrystalline layer (for example, the layer 4b in FIG. 2c). In general, impurities diffuse faster in polycrystal than in monocrystal. Accordingly, when polycrystalline silicon exists below the gate electrode, an impurity diffuses faster in the polycrystalline silicon during the diffusion step for source and drain regions. Then, the diffused parts on both sides may be electrically connected directly beneath the gate electrode, or they are almost electrically connected to each other.

This problem may be overcome by removing the polycrystalline silicon film beneath the gate electrode.

Figure 12:
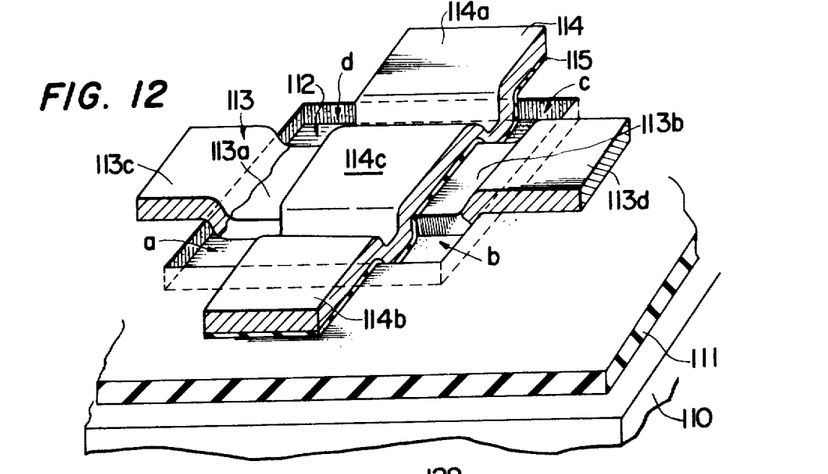
FIG. 12 shows a perspective view of a modified insulated silicongate type IC according to this invention.

FIG. 12 shows an example of such a construction. Numeral 110 indicates a silicon substrate, on which a silicon oxide film 111 is provided. An opening 112 is provided in the oxide film 111. Shown at 113 is an electrode made of a silicon film formed by a CVD process over the oxide film 111 and in the opening portion 112. The numerals 113a and 113b indicate source and drain regions, respectively, which are of single crystal silicon, epitaxially grown. Electrodes 113c and 113d, contiguous thereto, are formed of polycrystalline silicon.

A gate electrode 114 is provided in a manner to orthogonally intersect the source region 113a and the drain region 113b under the electrode 114, a silicon oxide film 115 is formed as an insulating film.

Of importance in the device is that the polycrystalline silicon film forming the electrode 113 is not provided beneath the gate electrode 114c. As shown by open spaces a, b, c and d in FIG. 12, polycrystalline silicon is removed from the periphery of the monocrystalline silicon layer. Although, the provision of the open spaces is not an indispensable requirement, it is an effective method in the sense of definitely confining the polycrystalline silicon film.

When, with the above construction, an impurity is diffused into the structure, parts which may be electrically short-circuited are not formed because the polycrystalline silicon film is not present under the electrode ends 114a and 114b of the gate electrode 114. The measure can be said to be a very effective method in manufacturing a small-sized MIS device.

EMBODIMENT 8

A high operation voltage MOS device can also be simply produced according to this embodiment.

Figure 13A:
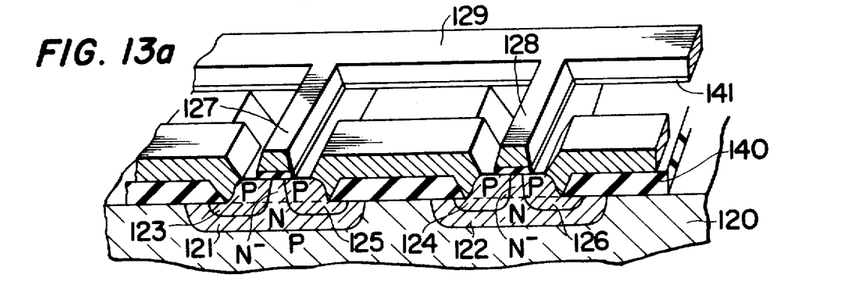
FIG. 13a is a sectional and perspective view showing the essential portions of a high operation voltage MOSFET according to this invention.
Figure 13B:
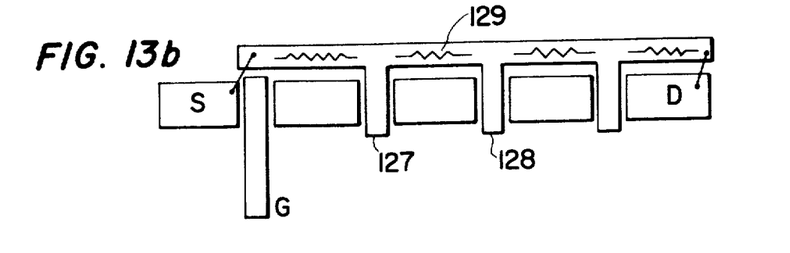

FIG. 13a is a sectional perspective view showing the essential portions of a high operation voltage MOS device, while FIG. 13b is a plan view showing the state in which the operation voltage is high by connecting MOSFETs in series and incorporating resistances between the gate electrodes.

This high operation voltage MOS device according to the present invention is manufactured by the following steps.

First, a p⁻ silicon substrate 120 is prepared, an oxide film 140 is formed in its surface by the thermal oxidation process, and the oxide film 140 is subjected to etching utilizing a photoresist and is rectilinearly provided with a number of openings for forming individual MOSFETs. Subsequently, phosphorus is diffused through the openings, to form N isolation layers 121 and 122. Next, a silicon film is deposited over the oxide film 140 and on the layers 121, 122 etc. by a CVD process. The silicon film is subjected to etching with photoresist, to form a polycrystalline electrode and interconnection portions. Further, a thin oxide film is formed, and a polycrystalline silicon film is deposited thereon by a CVD process. The oxide film and the polycrystalline silicon film are formed into gate electrodes 127 and 128 by etching, making use of a photoresist. The oxide film 141 is retained below the gate electrodes 127 and 128.

During the formation of the gate electrodes, the portion of a resistance body 129 coupling the gate electrodes is also formed. Subsequently, the portion of the resistance body 129 is protected by an oxide film or the like. The resistance body 129 is polycrystalline silicon doped with and impurity to have a conductivity the same as the conductivities of source and drain regions 123–126.

After the preparation stated above, the diffusion of a P-type impurity is carried out to form source regions 123 and 124, and drain regions 125 and 126 and to make the gate electrodes 127 and 128 conductive. Thereafter, the formation of a protective film and the wiring of electrodes as required are effected. The high operation voltage MOS device is thus completed.

Also, in this embodiment, the principal mask registration of the etching working in the formation of the unit MOSFETs may be carried out once. Accordingly, the dimensions of each unit MOS device become remarkably small and, moreover, all the dimensions of the high operation voltage MOS device become remarkably small.

EMBODIMENT 9

According to the present invention, an improved bi-MOS (bipolarMOS) device can be simply fabricated.

Figure 11:
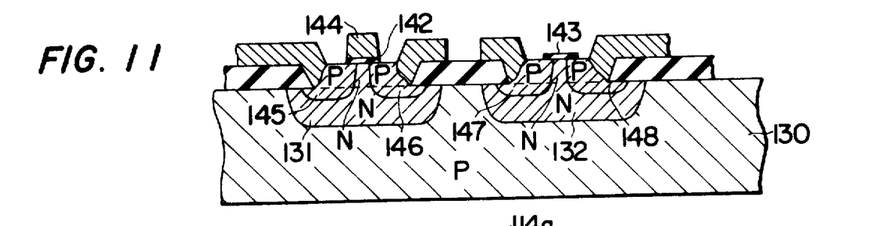

FIG. 11 is a sectional view showing the essential portions of a bi-MOS integrated circuit, in which N isolation regions 131 and 132 are formed in a P-type silicon substrate 130 by diffusion techniques. Then, boron is selectively diffused into the silicon layers and in the isolation regions, to form P type regions 145 to 148. The regions 145 and 146, and the P type silicon layer constitute a MOSFET, while the regions 147, 132 and 148 constitute a lateral bipolar transistor. The regions 147 and 148 work as an emitter and a collector, the region 132 works as a base. The numerals 142 and 143 are silicon oxide films.

As will be understood from the foregoing embodiments, the present invention has a characterizing feature in that the alignment of the gate electrode is made by utilizing the unevenness of the oxide film formed on the silicon substrate or the silicon film formed on the oxide film. Accordingly, the registration step which requires an accurate alignment of the photomask in the etching working is required only once. In consequence, the necessary dimensions of the MOS device become conspicuously small, and the size of the device, as a whole, can be made small.

The source and drain regions are connected onto the oxide film by the polycrystalline silicon film. They can, accordingly, be brought into contact with the aluminum wirings simply, without the registration step having been necessary in the manufacturing process of conventional MIS devices, so that the source and drain regions can be made markedly small.

In particular, since the polycrystalline silicon film is provided on the oxide film and is used for the wiring itself, the diffused layer wiring can be omitted and, hence, the parasitic wiring capacitance becomes small.

It is, therefore, possible to bestow a high speed processing function on the MOS device.

The source and drain regions define junctions only in the vicinity of the gate electrode, and their other parts are taken out as the wirings of the polycrystalline silicon film, so that the junction area becomes remarkably small.

Since the wiring layers are formed of polycrystalline silicon film in a manner to be continuous to the source and drain regions, allowance for the registration of the contacts becomes unnecessary, and the areas of the source and drain regions become small. The entire device is, therefore, small in size, which can serve to provide a high degree of integration.

While we have shown and described several embodiments in accordance with the present invention, it is understood that the same is not limited thereto but is susceptible of numerous changes and modifications as known to a person skilled in the art and, we therefore, do not wish to be limited to the details shown and described herein but intend to cover all such changes and modifications as are obvious to one of ordinary skill in the art.

We claim:

1. A metal insulator semiconductor field effect device comprising:
   a monocrystalline substrate;
   a first layer of insulating material disposed on the surface of said substrate and having an opening therethrough exposing a first surface portion of said substrate;
   a layer of monocrystalline semiconductor material having a first and second spaced-apart portions of a first conductivity type, disposed on the first surface portion of said substrate; first and second monocrystalline semiconductor regions formed beneath the respective first and second spaced-apart portions of said monocrystalline semiconductor layer, and having said first conductivity type, said first and second spaced-apart portions of said layer together with first and second regions respectively constituting source and drain regions of said field effect device;
   first and second polycrystalline semiconductor layers having said first conductivity type respectively contacting said first and second spaced-apart portions of said layer of monocrystalline semiconductor material and extending onto said first layer of insulating material, and respectively constituting source and drain electrodes for said source and drain regions;
   a second layer of insulating material disposed on a third portion of said layer of monocrystalline semiconductor material between said first and second spaced-apart portions thereof, said third portion of said layer of monocrystalline semiconductor material having a second conductivity type, opposite said first conductivity type; and
   a gate electrode disposed on said second layer of insulating material between said first and second spaced-apart surface portions of said substrate.

2. A semiconductor device according to claim 1, wherein said gate electrode is made of polycrystalline semiconductor material of said first conductivity type.

3. A semiconductor device according to claim 1, wherein said gate electrode is a metallic layer.

4. A semiconductor device according to claim 1, further including
   a third layer of insulating material disposed on said gate electrode, said first and second spaced apart portions of said layer of monocrystalline semiconductor material and said first and second polycrystalline semiconductor layers, and
   first and second electrode contact layers extending through said third layer of insulating material to contact said first and second polycrystalline semiconductor layers, respectively.

5. A semiconductor device according to claim 1, wherein the width of said first portion of said substrate is approximately 16 microns.

6. A semiconductor device according to claim 5, wherein the width of said gate electrode is approximately 8 microns.

7. A semiconductor device according to claim 1, further including
   a third polycrystalline semiconductor layer of said second conductivity type disposed on said first layer of insulating material and being contiguous with said second polycrystalline semiconductor layer, a fourth polycrystalline semiconductor layer of said first conductivity type disposed on said first layer of insulating material and being contiguous with said third polycrystalline semiconductor layer, whereby said third polycrystalline layer is disposed between said second and fourth polycrystalline layers, a third layer of insulating material disposed on said third polycrystalline semiconductor layer, and a second gate electrode disposed on said third layer of insulating material overlying said third polycrystalline semiconductor layer, and wherein said second and fourth polycrystalline layers constitute source and drain regions of a further field effect device, said second gate electrode constituting the gate electrode of said further field effect device, the first mentioned field effect device constituting a driver field effect device and said further field effect device constituting a load device therefor.

8. A semiconductor device according to claim 7, wherein the first mentioned gate electrode is made of polycrystalline semiconductor material of said first conductivity type.

9. A semiconductor device according to claim 8, wherein said first gate electrode is made of polycrystalline semiconductor material of said second conductivity type.

10. A metal insulator semiconductor field effect device comprising:

a semiconductor substrate of a first conductivity type;

a first layer of insulating material selectively disposed on the surface of said substrate and having an opening therethrough exposing a part of the surface of said substrate, said part including first and second spaced apart surface portions, third and fourth spaced apart surface portions, and a fifth surface portion, the third and fourth spaced-apart surface portions lying between the first and second spaced apart portions, the fifth surface portion lying between the third and fourth spaced apart portions;

first and second monocrystalline semiconductor regions formed beneath the respective first and second spaced-apart surface portions of said part of the surface of said substrate, and having a second conductivity type, opposite said first conductivity type;

first and second polycrystalline semiconductor layers of said second conductivity type, respectively contacting said first and second monocrystalline regions and extending onto said first layer of insulating material;

second and third layers of insulating material disposed on the third and fourth spaced-apart surface portions of said substrate between said first and second surface portions thereof;

a third monocrystalline semiconductor region of said second conductivity type, formed beneath said fifth surface portion of said substrate between said third and fourth surface portions thereof; and first and second gate electrodes respectively disposed on said second and third layers of insulating material between said first and second spaced apart surface portions and between said third and fourth spaced apart surface portions of said substrate, respectively; and wherein the impurity concentration of the third surface portion of said substrate beneath said second layer of insulating material is higher than the impurity concentration of said fourth surface portion of said substrate beneath said third layer of insulating material: and said first and third monocrystalline semiconductor region constitute source and drain regions of an enhancement-mode field effect device, said first polycrystalline semiconductor layer constituting an electrode for said first region: and said second and third monocrystalline semiconductor regions constitute source and drain regions of a depletion-mode field effect device, said second polycrystalline semiconductor layer constituting an electrode for said second region.

11. A semiconductor device according to claim 10, wherein each of said gate electrodes is made of polycrystalline semiconductor material of said second conductivity type.

12. A semiconductor device according to claim 10, wherein the impurity concentration of said third surface portion is one order of magnitude greater than that of said fourth surface portion.

13. A semiconductor device according to claim 11, wherein said second gate electrode contacts said third monocrystalline semiconductor region.

14. A metal oxide semiconductor field effect device comprising:

a semiconductor substrate of a first conductivity type;

a first layer of insulating material selectively disposed on the surface of said substrate and having first and second openings therethrough exposing first and second portions of the surface of said substrate;

a first layer of monocrystalline semiconductor material of a second conductivity type opposite said first conductivity type, disposed on said first exposed surface portion of said substrate;

first and second monocrystalline semiconductor regions of said first conductivity type formed beneath respective spaced-apart surface portions of said first semiconductor layer and being separated from each other by a portion of said first semiconductor layer therebetween, and constituting source and drain regions of a first MISFET having a first conductivity type channel;

third and fourth monocrystalline semiconductor regions of said second conductivity type formed in respective spaced-apart portions of said second portion of the surface of said substrate, and constituting source and drain regions with a second MISFET having a second conductivity type channel;

a second layer of insulating material selectively disposed on the surface of said first semiconductor layer between the spaced apart surface portions of said first semiconductor layers;

a third layer of insulating material selectively disposed on the second surface portion of said substrate between said third and fourth monocrystalline semiconductor regions;

first and second polycrystalline semiconductor layers of said first conductivity type respectively contacting said first and second monocrystalline regions and extending onto said first layer of insulating material, and constituting source and drain electrodes of said first MISFET;

third and fourth polycrystalline semiconductor layers of said second conductivity type respectively contacting said third and fourth monocrystalline regions and extending onto said first layer of insulating material, and constituting source and drain electrodes of said second MISFET;

a first gate electrode disposed on said second layer of insulating material between the spaced-apart surface portions of said first semiconductor regions; and a second gate electrode disposed on said third layer of insulating material between said spaced-apart third and fourth monocrystalline semiconductor regions;

whereby respective first and second MISFETs of opposite channel conductivity types are formed in said first and second surface portions of said substrate.

15. A semiconductor device according to claim 14, wherein said first gate electrode is made of polycrystalline semiconductor material of said first conductivity type.

16. A semiconductor device according to claim 14, wherein said second gate electrode is made of polycrystalline semiconductor material of said second conductivity type.

17. A semiconductor device according to claim 15, wherein said second gate electrode is made of polycrystalline semiconductor material of said second conductivity type.

18. A semiconductor device according to claim 14, further including a fifth monocrystalline region of said second conductivity type disposed in said substrate beneath and contiguous to said first and second monocrystalline regions and said first layer of monocrystalline material.

19. A semiconductor device according to claim 18, wherein a portion of said first semiconductor layer between said first and second monocrystalline regions and said fifth monocrystalline region are of a relatively high impurity concentration.

20. A semiconductor device according to claim 18, wherein said fifth monocrystalline region has an impurity concentration higher than that of said first layer directly beneath said second layer of insulating material.

21. A metal insulator semiconductor field-effect device comprising:

a semiconductor substrate of a first conductivity type;

a first layer of insulating material selectively disposed on the surface of said substrate and having first and second openings therethrough exposing first and second portions of the surface of said substrate;

a monocrystalline semiconductor layer of the first conductivity type having an impurity concentration different from that of said substrate, disposed on the first portion of said substrate;

first and second monocrystalline semiconductor regions of a second conductivity type, opposite said first conductivity type, formed in spaced-apart surface portions of said monocrystalline semiconductor layer, and forming source and drain regions of a first field effect device having a first gate threshold voltage;

third and fourth monocrystalline semiconductor regions of said second conductivity type formed in spaced-apart surface portions of said second portion of said substrate, and forming source and drain regions of a second field effect device having a second gate threshold voltage different from said first gate threshold voltage;

first and second polycrystalline semiconductor layers of said second conductivity type respectively contacting said first and second monocrystalline regions and extending onto said first layer of insulating material, and constituting source and drain electrodes of said first field effect device;

a second layer of insulating material disposed on said monocrystalline semiconductor layer between said first and second monocrystalline regions;

a third layer of insulating material disposed on said substrate between said third and fourth monocrystalline regions;

a first gate electrode disposed on said first insulating layer between said first and second monocrystalline regions; and a second gate electrode disposed on said second insulating layer between said third and fourth monocrystalline regions.

22. A semiconductor device according to claim 21, wherein said first gate electrode is made of polycrystalline semiconductor material of said second conductivity type.

23. A semiconductor device according to claim 21, wherein said second gate electrode is made of polycrystalline semiconductor material of said second conductivity type.

24. A semiconductor device according to claim 22, wherein said second gate electrode is made of polycrystalline semiconductor material of said second conductivity type.

25. A semiconductor device comprising:

a semiconductor substrate of a prescribed conductivity type;

a first layer of insulating material selectively formed on the surface of said substrate and having first and second openings therethrough, respectively exposing first and second surface portions of said substrate;

first and second monocrystalline semiconductor regions of a first conductivity type disposed on said first and second surface portions of said substrate;

third and fourth semiconductor monocrystalline regions, of a second conductivity type, opposite said first conductivity type, disposed in spaced-apart surface portions of said first semiconductor region, and constituting respective source and drain regions of a MOSFET;

fifth and sicth monocrystalline semiconductor regions of said second conductivity type disposed in spaced-apart surface portions of said second semiconductor region, and constituting respective emitter and collector regions of a lateral bipolar transistor, the base region of which is constituted by the semiconductor material of said first conductivity type of said second region between said fifth and sixth regions;

first, second, third and fourth polycrystalline semiconductor layers of said second conductivity type respectively disposed in contact with said third, fourth, fifth and sixth monocrystalline semiconductor regions and extending onto said first layer of insulating material, and constituting respective source, drain, emitter, and collector electrodes;

second and third layers of insulating material respectively disposed on said first and second regions between the spaced-apart surface portions thereof; and a gate electrode disposed on said second layer of insulating material between said third and fourth regions; and wherein said prescribed conductivity type is said second conductivity type;

whereby said MOSFET and said lateral bipolar transistor are formed in said first and second surface portions of said substrate, respectively.

26. A semiconductor device according to claim 25, wherein said gate electrode is made of polycrystalline semiconductor material of said second conductivity type.

27. A metal-insulator semiconductor field effect device comprising:
a semiconductor substrate of a first conductivity type;
a first layer of insulating material selectively formed on the surface of said substrate and having first and second openings therethrough, exposing first and second surface portions of said substrate;
first and second layers of monocrystalline semiconductor material each having spaced apart portions of the first conductivity type disposed on the first and second surface portions of said substrate;
first and second monocrystalline semiconductor regions of said first conductivity type, disposed in spaced-apart surface portions of said first semiconductor layer, and constituting source and drain regions of a first field effect device,
third and fourth monocrystalline semiconductor regions of said first conductivity type disposed in spaced-apart surface portions of said second semiconductor layer, and constituting source and drain regions of a second field effect device;
first, second, third and fourth polycrystalline semiconductor layers, of said first conductivity type, respectively disposed in contact with said first, second, third and fourth regions and extending onto said first layer of insulating material and constituting respective electrodes for the source and drain regions of said first and second field effect devices;
second and third layers of insulating material respectively disposed on portions of said first and second monocrystalline layers between the spaced apart portions thereof which are of a second conductivity type opposite said first conductivity type;
first and second gate electrodes disposed on second and third layers of insulating material between said first and second regions, and between said third and fourth regions, respectively.

28. A semiconductor device according to claim 27, further including first and second surface semiconductor regions of said second conductivity type disposed beneath said first and second surface portions of said substrate and wherein the impurity concentration of the surface portions of said first and second layers between the spaced-apart surface portions thereof is lower than the impurity concentration of said first and second surface regions.

29. A semiconductor device according to claim 27, wherein each of said gate electrodes is made of polycrystalline semiconductor material of said first conductivity type.

30. A semiconductor device according to claim 27, wherein said second and third polycrystalline semiconductor layers are contiguous to one another and further including a resistance element formed on said first layer of insulating material and contiguous to said first and second gate electrodes.

31. An insulated gate field effect transistor comprising:
a monocrystalline substrate having a substantially plane major surface;
a first relatively thick insulating film formed on said major surface of said substrate with an opening to expose a portion of said major surface;
a semiconductor material layer of a first conductivity type continuously deposited on the exposed surface portion defined by said opening and on said first insulating film;
source and drain regions of a second conductivity type formed in said semiconductor layer formed on said exposed surface portion, which source and drain regions are spaced from each other;
a second relatively thin insulating film formed on said semiconductor layer so as to cover at least the surface thereof between said source and drain regions; and
a gate electrode formed on said second insulating film so as to cover at least the surface of said semiconductor layer between said source and drain regions.

* * * * *